(12) United States Patent  
Pas et al.

(10) Patent No.: US 7,416,949 B1  
(45) Date of Patent: Aug. 26, 2008

(54) FABRICATION OF TRANSISTORS WITH A FULLY SILICIDED GATE ELECTRODE AND CHANNEL STRAIN

(75) Inventors: Michael Francis Pas, Richardson, TX (US); Shaofeng Yu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 22 days.

(21) Appl. No.: 11/674,902

(22) Filed: Feb. 14, 2007

(51) Int. Cl.  
*H01L 21/8234* (2006.01)  
*H01L 21/3205* (2006.01)

(52) U.S. Cl. .............. 438/275; 438/585; 257/E21.623

(58) Field of Classification Search .............. 438/275, 438/637, 630, 585, 618, 587, 720, 721, 754, 438/755; 257/E21.636, E21.593, E21.623, 257/E21.627, E21.641  
See application file for complete search history.

(56) References Cited

U.S. PATENT DOCUMENTS

2004/0245583 A1* 12/2004 Horiuchi et al. ............. 257/408  
2006/0019437 A1   1/2006 Murto et al.  
2007/0218637 A1*  9/2007 Harada et al. ............... 438/275  
2007/0275528 A1* 11/2007 Koike ......................... 438/283

OTHER PUBLICATIONS

Kittle, et al., "Scalability of Ni FUSI gate processes: phase and Vt control to 30 nm gate lengths", 2005 Symposium on VLSI Technology Digest of Technical Papers, pp. 72-73.

* cited by examiner

*Primary Examiner*—Scott B. Geyer  
*Assistant Examiner*—Mohsen Ahmadi  
(74) *Attorney, Agent, or Firm*—Wade J. Brady, III; Frederick J. Telecky, Jr.

(57) ABSTRACT

Manufacturing a semiconductor device by forming first and second gates including patterning a silicon-containing layer on a substrate. Etched simultaneously the patterned silicon-containing layer of the first gate, and first substrate portions adjacent to the first gate to form a first gate electrode and source and drain openings. Forming SiGe simultaneously in first gate electrode source and drain openings. Second gate and second substrate portions are masked. SiGe is removed from an upper surface of the first gate to form a second opening therein. A metal deposited on the first and second gates forms a metal layer thereon. Annealing first and second gates to form FUSI first and second gate electrodes. A metal amount at an interface of the FUSI gate electrode layer and an underlying gate dielectric layer is greater than at a second interface of the second FUSI gate electrode layer and an underlying second gate dielectric layer.

15 Claims, 8 Drawing Sheets

FABRICATION OF TRANSISTORS WITH A FULLY SILICIDED GATE ELECTRODE AND CHANNEL STRAIN

TECHNICAL FIELD

The disclosure is directed, in general, to semiconductor devices, and more specifically, to the manufacture of transistors having a fully silicided gate (FUSI) electrode and strained channel, and to devices having such transistors.

BACKGROUND

The continuing push to produce faster semiconductor devices with lower power consumption has resulted in device miniaturization. As part of these efforts, there is interest in the use metal gate electrodes and in producing channel strain in transistors. The use of metal gates can avoid the depletion of gate charge carriers at the interface between the gate and gate dielectric, such as encountered when a polysilicon gate electrode is biased to invert the channel. The production of strain can improve carrier mobility in the channel region of semiconductor substrates.

Unfortunately, the manufacture of semiconductor devices having metal gates and channel strain are not without problems. The addition of manufacturing processes for metal gate into existing semiconductor device manufacturing processes has been problematic. E.g., it has proven difficult to use a single metal with different work function in complementary nMOS and pMOS transistors. Additionally, the incorporation of strain-producing materials into semiconductor substrates without causing a high leakage current, and making electrical contacts to such materials, has also been problematic. The integration of metal gates and channel strain fabrication process into the same transistor using an efficient process presents additional challenges.

Accordingly, what is needed is a method for manufacturing semiconductor devices that integrates the manufacture of metal gate electrodes of the appropriate work function with a strained channel.

SUMMARY

The disclosure provides a method of manufacturing a semiconductor device. The method comprises forming first and second gates, including patterning a silicon-containing layer on a semiconductor substrate. The patterned silicon-containing layer of the first gate, and first substrate portions adjacent to the first gate, are etched simultaneously to form a first gate electrode opening and source and drain openings, respectively. The second gate and second substrate portions adjacent to the second gate are masked. The method also comprises forming SiGe simultaneously in the first gate electrode openings and in the source and drain openings, wherein the second gate and the second substrate portions are masked. The SiGe is removed from an upper surface of the first gate to form a second gate electrode opening therein. A metal is deposited simultaneously on the first and second gates to form a metal layer thereon. The first and second gates are annealed to form fully silicided first and second gate electrodes. An amount of the metal at an interface of the fully silicided gate electrode layer and an underlying gate dielectric layer is greater than an amount of the metal at a second interface of the second fully silicided gate electrode layer and an underlying second gate dielectric layer.

Another embodiment is method of manufacturing an integrated circuit that comprises forming one or more transistors on a semiconductor substrate, wherein at least one of the transistors is manufactured by steps that include the above-described process. The transistor's manufacture further includes depositing a sacrificial layer on the substrate, wherein the first and second gates are covered by said sacrificial layer, and uncovering upper surfaces of the first and second gates, wherein the SiGe-filled source and drain openings remained covered. The method also includes depositing a pre-metal dielectric layer on the substrate and inter-level dielectric layers on the pre-metal dielectric layer and forming interconnects through one or more of the inter-level dielectric layers to interconnect the at least one transistors to each other, or to other transistors of the integrated circuit.

Another embodiment is an integrated circuit. The integrated circuit comprises one or more transistors on or in a semiconductor substrate. At least one of the transistors includes a gate electrode and source and drain structures. The gate electrode has a fully silicided gate electrode layer with a ratio of Ni:Si ranging from about 2:1 to about 3:1. The source and drain structures are located in openings of the substrate and adjacent to the gate electrode, wherein the source and drain structures are filled with SiGe.

DETAILED DESCRIPTION

One embodiment of the disclosure is a method of manufacturing a semiconductor device. FIGS. 1 to 10 present cross-section views of selected steps of an example implementation of a method of fabricating a semiconductor device 100 according to the principles of the present disclosure. In some embodiments the device 100 includes one or more transistors (e.g., transistors 102, 104) such as metal-on-oxide (MOS), transistors, such as PMOS or nMOS transistors. The method includes forming at least one of these transistors 102 on a semiconductor substrate 105 by a manufacturing process as disclosed herein.

Figure 1:
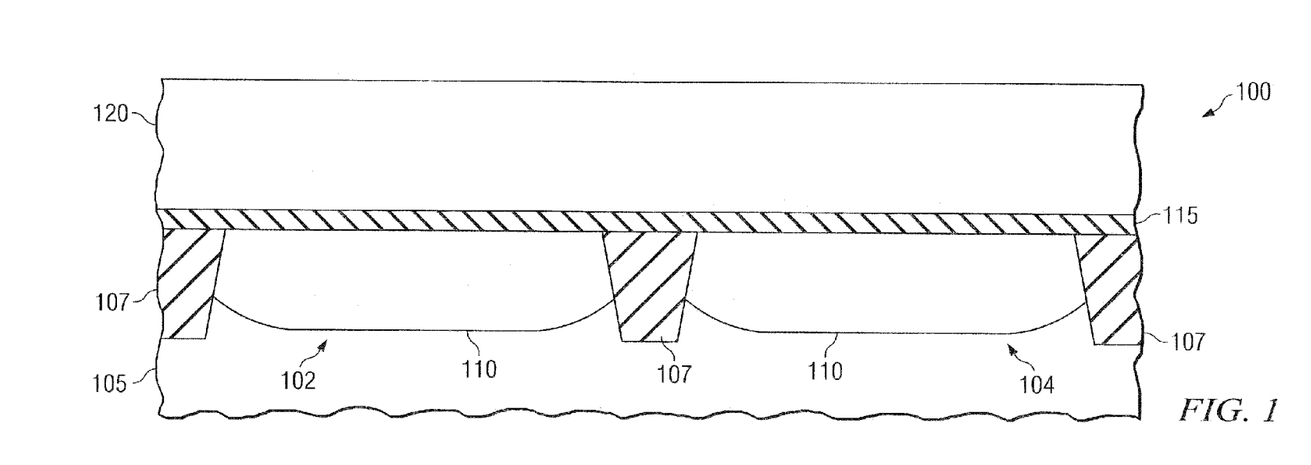
FIGS. 1 to 10 present cross-section views of selected steps in example implementation of a method of fabricating a semiconductor device according to the principles of the present disclosure.

FIG. 1 shows the device 100 after forming an isolation structure 107 (e.g., shallow trench isolation or field oxide structure) in or on a semiconductor substrate 105. E.g., forming isolation structures 107 can include a dry-etch, wet-etch, or a combination thereof, to form openings in a silicon substrate 105, followed by depositing an insulator (e.g., silicon dioxide) in the openings. The substrate 105 can include a silicon layer that is epitaxially grown on a silicon-germanium substrate, or other types of semiconductive material such as indium phosphide or gallium arsenide. The substrate can be implanted with n- or p-type dopants to form doped wells 110.

FIG. 1 also shows the device 100 after depositing a gate dielectric layer 115 on the substrate 105, and after depositing a silicon-containing layer 120 (e.g., polysilicon) on the gate dielectric layer 115. Example insulating materials include plasma nitrided oxide, hafnium oxide, silicon oxide or high-k dielectric materials (e.g., dielectric constant of 4 or greater). Chemical vapor deposition (CVD), physical layer deposition (PVD), atomic layer deposition (ALD), or other conventional methods can be used to deposit the layers 115, 120.

Figure 2:
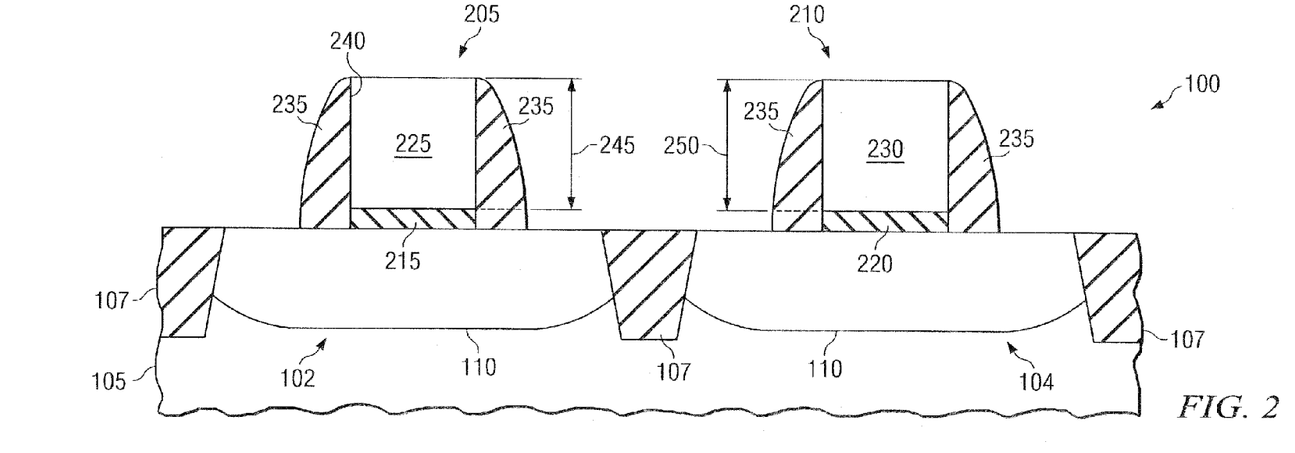

FIG. 2 shows the device 100 after forming first and second gates 205, 210. Forming the first and second gates 205, 210 can include patterning, in separate or combined steps, the dielectric layer 115 and the silicon-containing layer 120 (FIG.

1), to form patterned first and dielectric layers 215, 220 and first and second silicon-containing electrode layers 225, 230, respectively. Forming the first and second gates 205, 210 can also include forming insulating sidewalls 235 on the vertical walls 240 of the patterned dielectric layers 215, 220 and patterned silicon-containing layers 225, 230. As illustrated in FIG. 2, a thickness 245 of the patterned first silicon-containing electrode layer 225 can be substantially the same as a thickness 250 of the second patterned silicon-containing electrode layer 230. E.g., both thicknesses 245, 250 can equal about 50 to 150 nm±10 percent, and in about 80 to 100 nm±10 percent in some cases.

Figure 3:
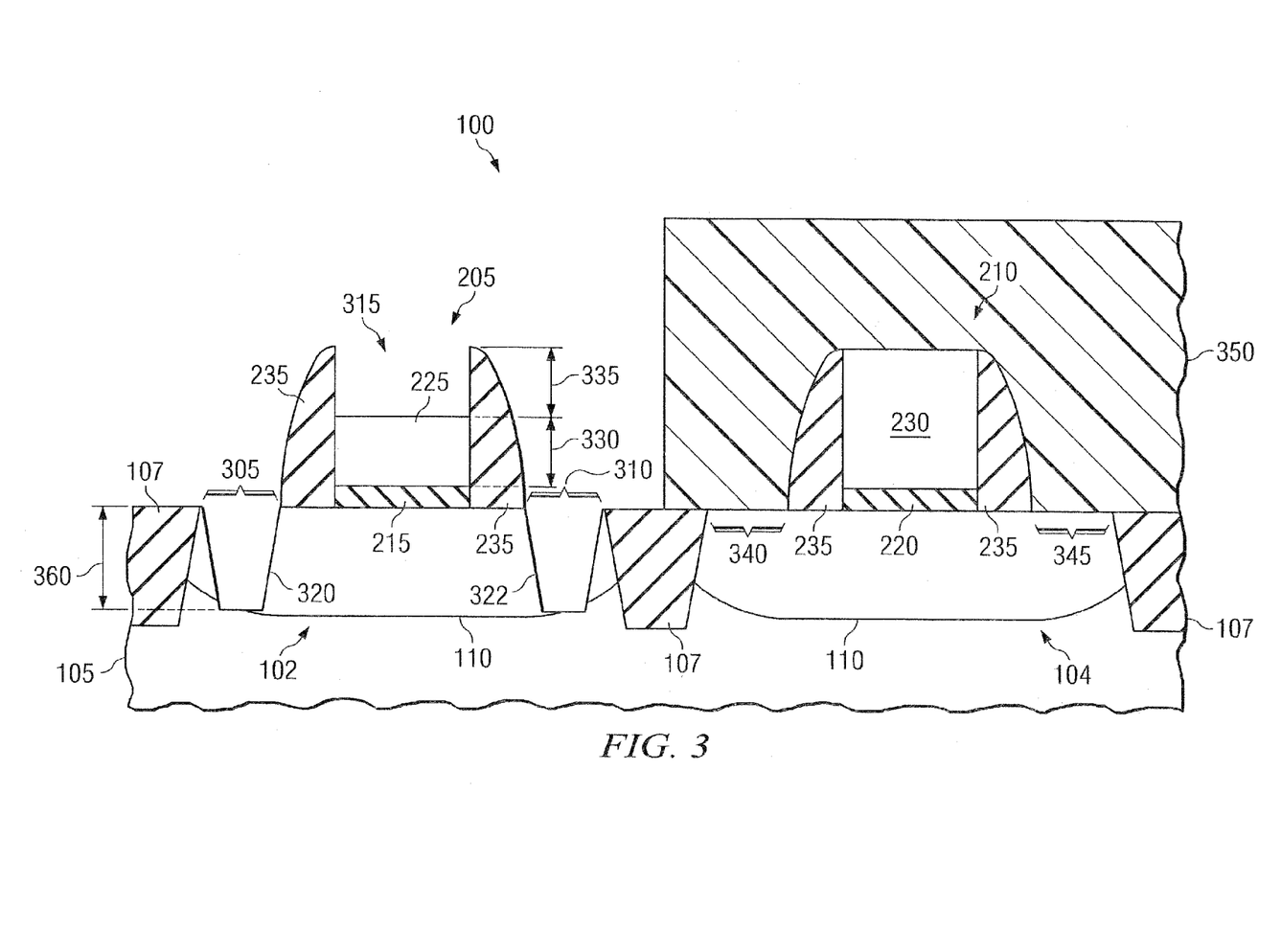

FIG. 3 shows the device 100 after etching simultaneously, the first patterned silicon-containing electrode layer 225 of the first gate 205 and first substrate portions 305, 310, adjacent to the first gate 205, to form a first gate electrode opening 315 and source and drain openings 320, 322 respectively. A portion of the first patterned silicon-containing electrode layer 225 remains in the first gate 205 at the conclusion of the simultaneous etch. The thickness 330 of the patterned and etched first silicon-containing electrode layer 225 is less than the layer's 225 thickness 245 (FIG. 2) before the simultaneous etch. The second gate 210 and second substrate portions 340, 345, adjacent to the second gate 210, are masked during the simultaneous etch. E.g., a mask layer 350 comprising a conventional oxide layer, nitride layer, or both, can be blanket deposited on the substrate 105 and then patterned to expose those portions of the at least one transistor 102 to which the simultaneous etch is then applied.

Some embodiments of the simultaneous etch are configured to be selective towards the insulating sidewalls 235 and mask layer 350. E.g., the etch rate of the substrate 105 and first silicon-containing electrode layer 225 is at least about 10 times greater than the etch rate of the insulating sidewalls 235 or mask layer 350. Some embodiments of the simultaneous etch are configured to remove the substrate 105 and patterned first silicon-containing electrode layer 225 at substantially the same rate. That is, the simultaneous etch removes about the same thickness 355 of the patterned first silicon-containing electrode layer 225 as a thickness 360 of substrate 105 removed. E.g., in some cases, the thicknesses 355, 360 removed are both equal to within about 10 percent, e.g., about 50 nm±5 nm.

Certain embodiments of the simultaneous etch include exposing the first gate 205 and first substrate portions to an HBr-containing etchant gas (e.g., a reactive ion etch comprising HEr). Embodiments of the simultaneous etch can include an isotropic etch and an anisotropic etch. In some cases both the isotropic etch and anisotropic etch comprise HEr. E.g., the simultaneous etch can includes HBr, HCl, combinations thereof, or other conventional substrate etchants.

Figure 4:
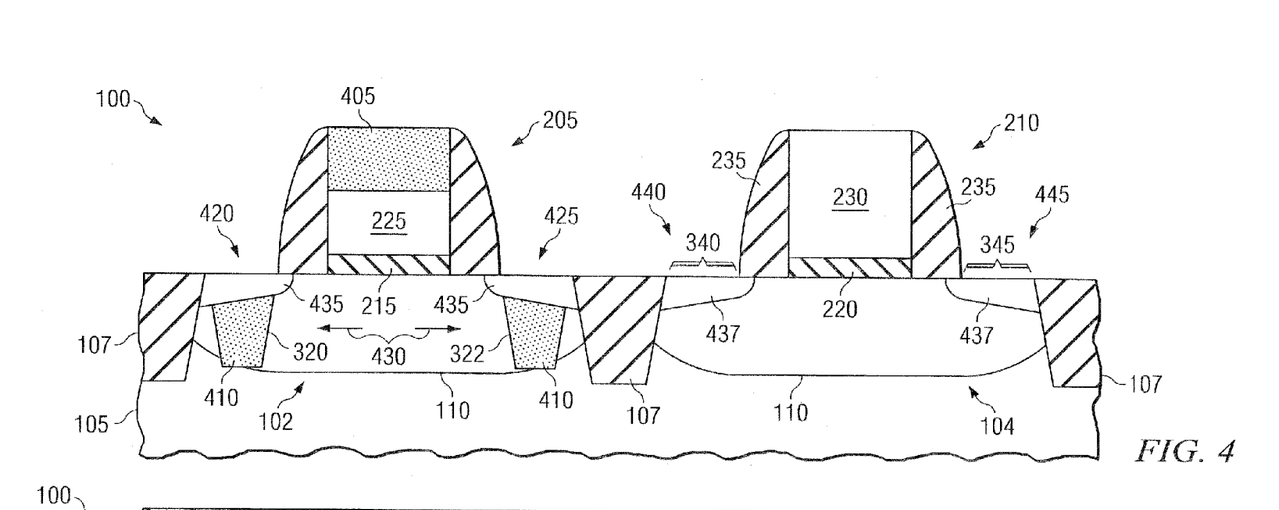

FIG. 4 shows the device 100 after forming SiGe 405, 410 simultaneously in the first gate electrode opening 315 (FIG. 3) and the source and drain openings 320, 322 respectively. The second gate 210 and second substrate portions 340, 345 adjacent to the second gate 210 are masked and SiGe 405, 410 is formed in the openings 315, 320, 322 (FIG. 3). For instance, the mask layer 350 (e.g., an oxide layer) can be left over the second gate 210 and second substrate portions 340, 345. The SiGe 410 in the source and drain openings 320, 322 form first source and drain structures 420, 425 that configured to produce a compressive stress in the channel region 430 of the first transistor 102. The SiGe 405 in the first gate electrode opening 315 can also produce a compressive stress in the channel region 430.

Forming the SiGe 405, 410 can include growing SiGe in each of the first gate electrode opening 315 and source and drain openings 320, 322 until the openings 315, 320, 322 are filled with SiGe. An example SiGe 405, 410 forming process includes a chemical vapor deposition process having about 0 to 50 percent atomic percent Ge at different stages in the deposition process. E.g., SiGe can be selectively epitaxially grown in the openings 315, 320, 322 (e.g., grown on silicon surfaces of the openings 315, 320, 322 to the exclusion of silicon oxide or silicon nitride-covered surfaces on the substrate) using a CVD process comprising $SiH_4$, or $Si_2H_6$, plus $GeH_4$ and HCl, and optionally $B_2H_6$. One skilled in the art would appreciate that there are a variety of different ways to grow SiGe in the openings 315, 320, 322.

FIG. 4 also shows the device 100 after masking the second transistor 104 (e.g., mask layer 350 in FIG. 3, or a photoresist mask) and implanting dopants 435 into the first source and drain structures 420, 425. E.g., p-type dopants are implanted when the transistor 102 is a PMOS transistor. Implanting the dopants 435 serves to lower the resistance the source and drain structures 420, 425. Additionally, either before or after forming the first source and drain structures 420, 425, the first transistor 102 can be masked and dopants 437 implanted into the second substrate portions 340, 345 as part of forming second source and drain structures 440, 445 of the second transistor 104. E.g., n-type dopants are implanted when the transistor 104 is an nMOS transistor. One skilled in the art would be familiar with the procedures to mask non-implanted areas, implant dopants, and the means to diffuse the dopants into the substrate 105 using conventional processes like rapid thermal or laser annealing.

Figure 5:
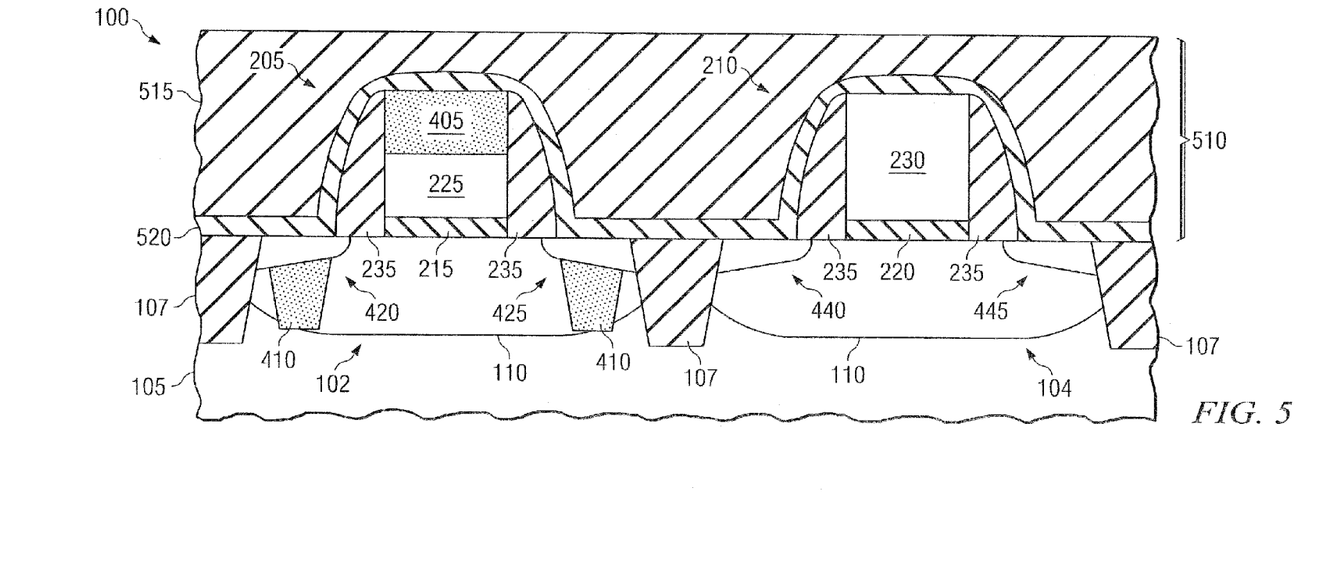

FIG. 5 shows the device 100 after depositing a sacrificial layer 510 on the substrate 105, where the first and second gates 205, 210 are covered by the PMD layer 510. E.g., after removing the mask layer 350 (FIG. 3), a sacrificial layer 510 layer comprising an insulating layer 515 composed of silicon dioxide, tetra-ethyl-ortho-silicate (TEOS), or similar material can be deposited by CVD. Depositing the sacrificial layer 510 can further include depositing a nitride layer 520 (e.g., silicon nitride layer) using CVD.

Figure 6:
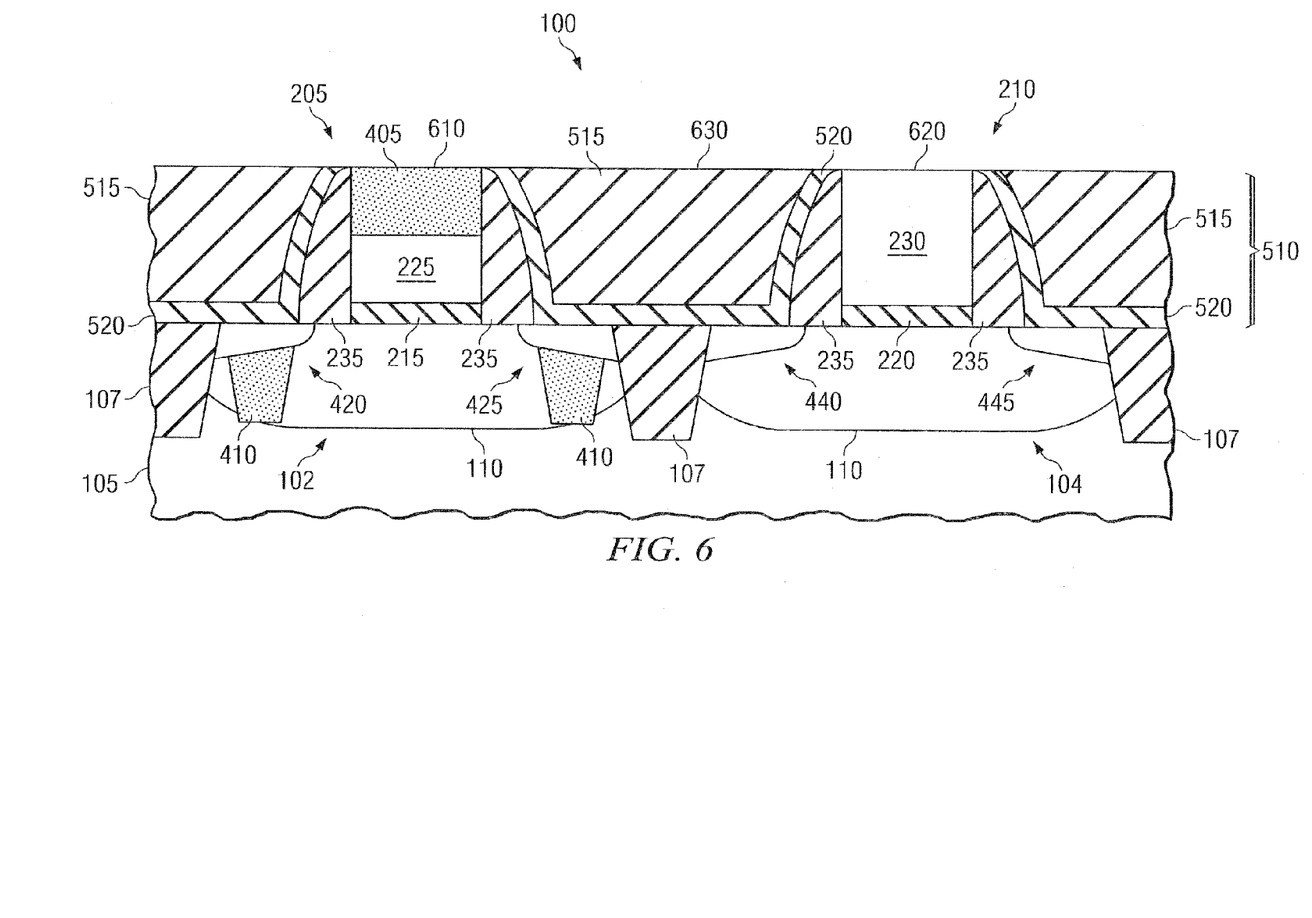
Figure 7:
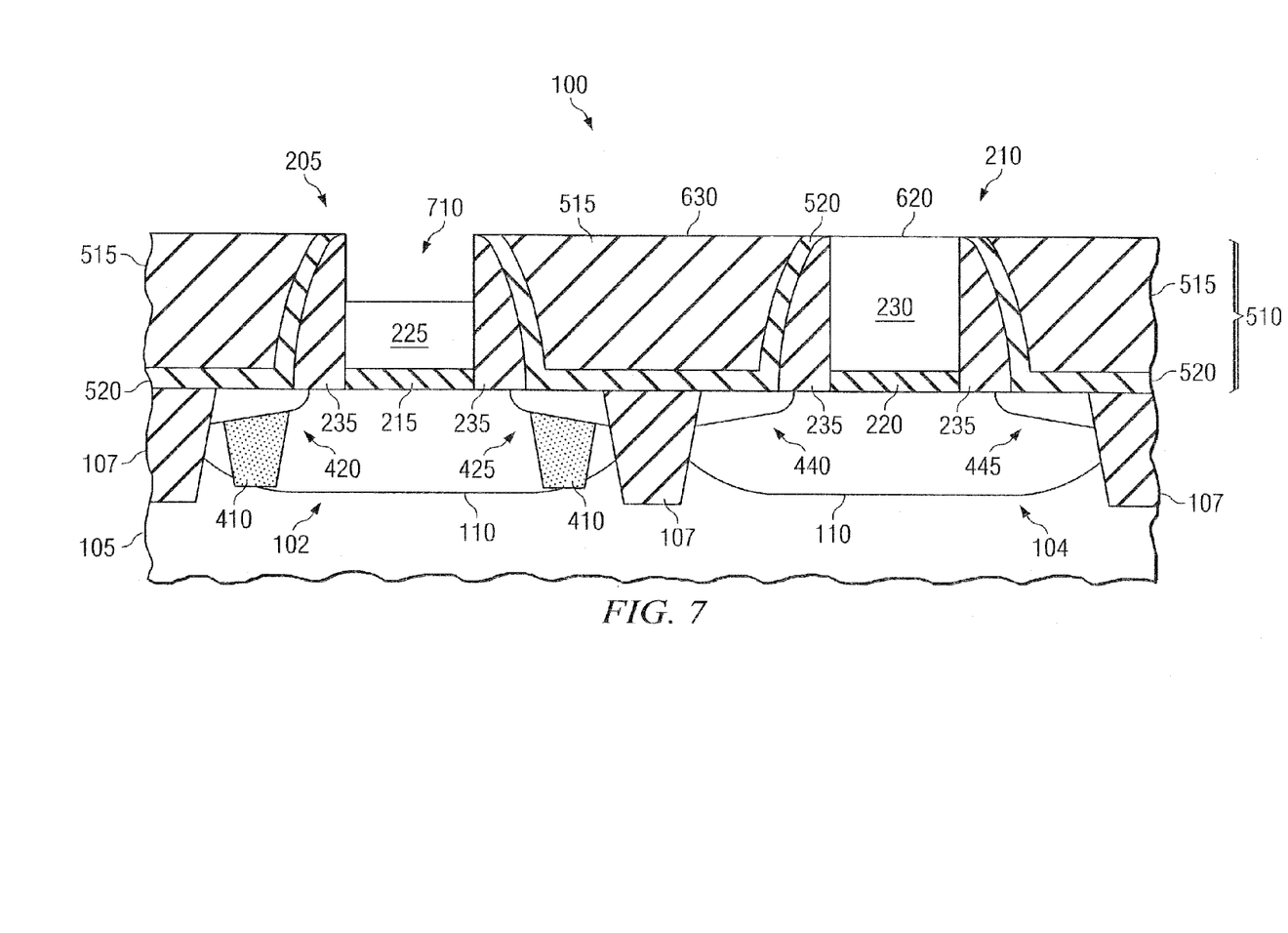

FIGS. 6 and 7 show the device 100 at selected stages of removing the SiGe 405 from the first gate 205. FIG. 6 shows the device 100 after uncovering upper surfaces 610, 620 (e.g., the surfaces facing away from the substrate) of first and second gates 205, 210. Uncovering the upper surfaces 610 can include a CMP process. E.g., in some cases the CMP process includes the use of a polishing pad and slurry that planarizes the insulating layer 515 of the sacrificial layer 510 and stops on the nitride layer 520. Portions of the nitride layer 520 that lay directly on the upper surfaces 610, 620 can then be removed using an etching procedure, e.g., a plasma etch. In other cases, however, both of the insulating layer 515 and nitride layer 520 that are over the upper surfaces 610, 620 can be removed by the CMP process, which can comprise single or multiple polishing steps. As illustrated in FIG. 6 the upper surfaces 610, 620 of the gates 205, 210 can be coplanar with the uppermost surface 630 of CMP planarized sacrificial layer 510. As also illustrated, the SiGe-filled the source and drain openings 320, 322 remained covered by the sacrificial layer 510.

FIG. 7 shows the device 100 after subjecting the upper surfaces 610, 620 of the gates 205, 210 (FIG. 6) to an etch process to thereby selectively remove the SiGe 405 (FIG. 6) from the first gate 205 and form a second gate electrode opening 710 therein. In some cases, the second gate electrode opening 710 is substantially the same in size as the first gate electrode opening 315 (FIG. 3). That is, substantially all of the SiGe 405 is removed (e.g., at least about 99 percent) from the first gate 205, while the sidewalls 235 and remaining portion of the first patterned silicon-containing electrode layer 225 are left substantially unaltered by the SiGe removal etch process. E.g., the etch rate of the SiGe 405 (FIG. 6) is at least about 100 times greater than the etch rate of the insulating sidewalls 235 or of the first patterned silicon-containing electrode layer 225 that remains in the first gate 205.

In some cases, the SiGe removal etch is selective to the second gate 210. That is, the process for removing the SiGe 405 from the first gate 205 leaves the second gate 210 substantially unaltered. E.g., the removal rate of the second patterned silicon-containing electrode layer 230 is less than about 10 percent, and in some cases, less than about 1 percent, of the removal rate of the SiGe 405 of the first gate 205. Some embodiments of the selective etch process comprise a wet etch comprising $NH_4OH$, $H_2O_2$ and $H_2O$. E.g., the etch process can be a wet etch using a mixture of $NH_4OH:H_2O_2:H_2O$ in ratios of about 1:1:5, respectively.

In other cases, however, the etch process is not selective. Rather, the second gate 210 is covered with a mask (e.g., a mask similar to the mask layer 350 depicted in FIG. 3) to prevent the undesired removal of the second patterned silicon-containing electrode layer 230 while removing the SiGe 405 from the first gate 205. As further illustrated in FIG. 7, removing the SiGe 405 from the first gate 205 also leaves the SiGe-filled source and drain structures 420, 425 substantially unaltered because these structures 420, 425 are covered by the sacrificial layer 510.

Figure 8:
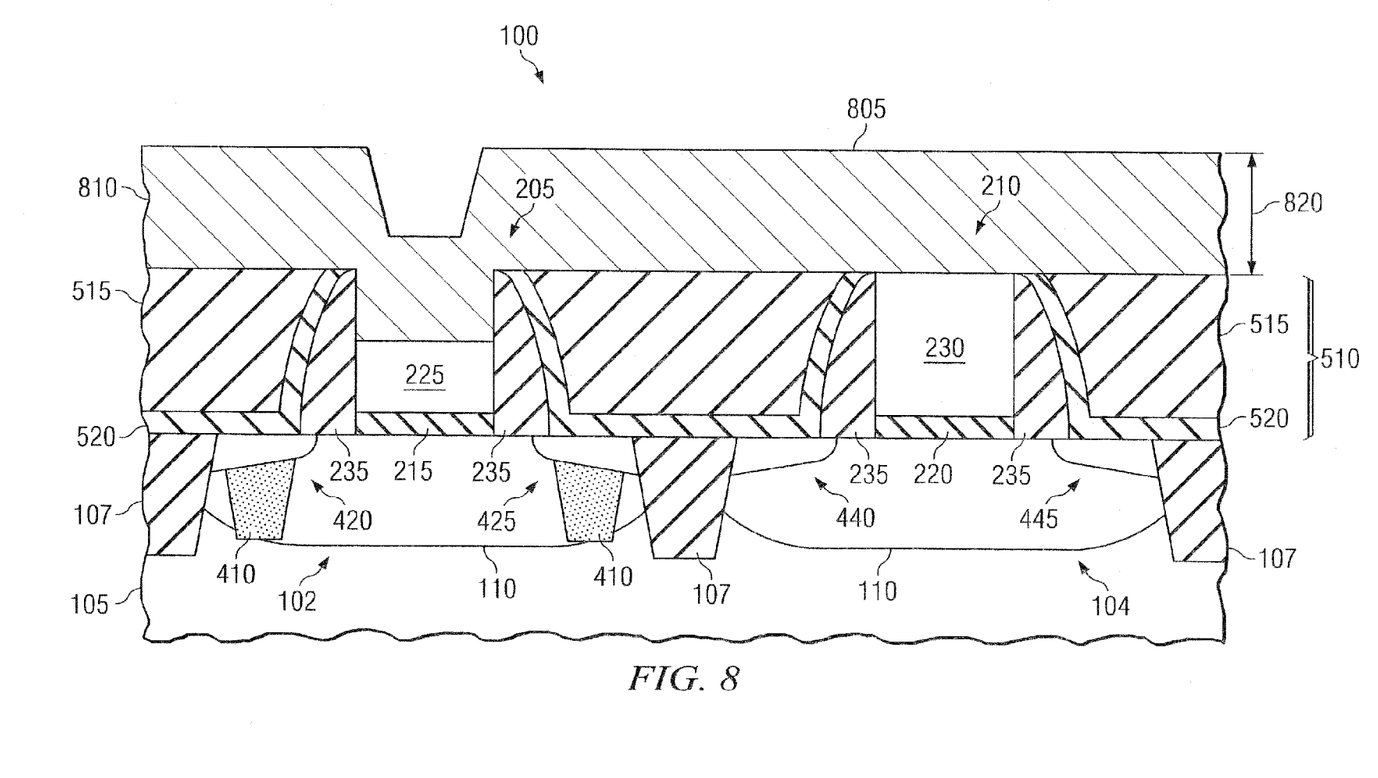

FIG. 8 shows the device 100 after depositing a metal 805 simultaneously on the first and second gates 205, 210 to form a metal layer 810 thereon. The metal layer 810 can be deposited directly on the patterned first and second silicon-containing layers 225, 230. In some cases, the metal layer includes a refractory metal such as nickel, deposited by conventional means (e.g., a PVD process).

Substantially the same thickness 820 of metal layer 810 is deposited on the first and second gates 205, 210 in a single metal deposition step. As illustrated in FIG. 8, sufficient amounts of the metal can be deposited so as to fill the second gate electrode opening 710 (FIG. 7). However, because a portion of the silicon-containing layer of the first gate 205 was previously removed (FIG. 3), the first and second gates 205, 210 have different thickness ratios of the metal layer 810 to the patterned first and second silicon-containing layers 225, 230.

For instance, a ratio of the thickness 820 of the metal layer 810 to the thickness 330 (FIG. 3) of the patterned and etched first silicon-containing layer 225 is greater than a ratio of the thickness 820 of the metal layer 810 to the thickness 250 (FIG. 2) of the patterned second silicon-containing layer 230. E.g., a ratio of the thickness 820 of the metal layer 810 to a thickness 330 of the silicon-containing layer 225 for the first gate 205 ranges from about 2:1 to 3:1. E.g., a ratio of a thickness 820 of the metal layer 810 to a thickness 250 of the silicon-containing layer 230 for the second gate electrode 210 ranges from about 0.9:1 to 1.1:1.

Figure 9:
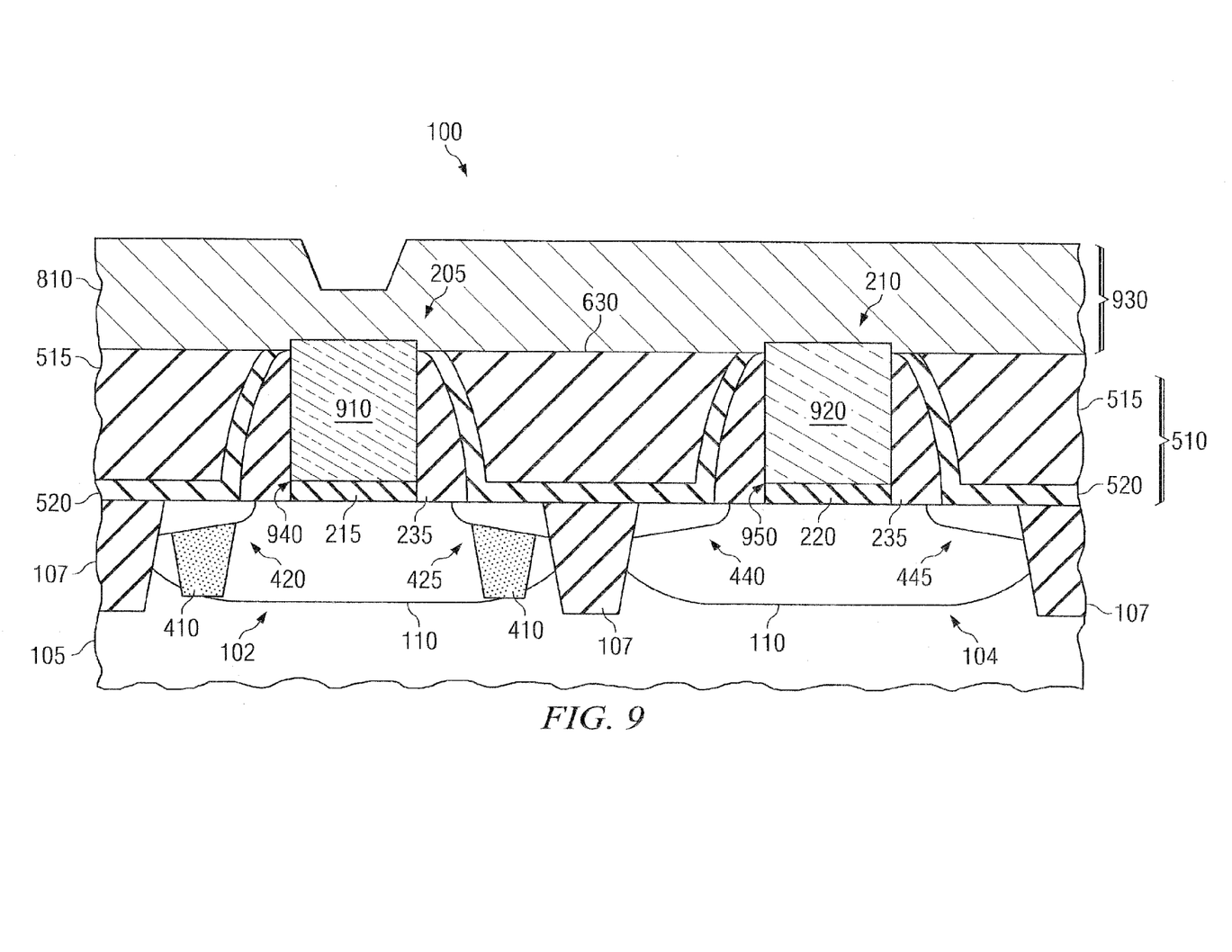

FIG. 9 shows the device 100 after annealing the first and second gates 205, 210 to form fully silicided first and second gates electrodes 910, 920. That is, the materials of the first patterned silicon-containing electrode layer 225 and the metal layer 810 (FIG. 8) are heated to a temperature that is sufficient to inter-diffuse the atoms of the first patterned silicon-containing electrode layers 225 and the metal layer 810 to form the first fully silicided electrode layer 910. Similarly, the anneal causes the second patterned silicon-containing electrode layers 225 and the metal layer 810 to inter-diffuse to form the second fully silicided electrode layer 920.

FIG. 9 shows that the fully silicided first and second gates electrodes 910, 920 can protrude above the uppermost surface 630 of the planarized sacrificial layer 510. This follows because the volume occupied by the metal-silicide crystal structure of the fully silicided first and second gates electrodes 910, 920 can be greater than the sum of the volumes of silicon-containing electrode layers 225, 230 and the metal layer 810 (FIG. 8) that the electrode 910, 920 were formed from. E.g., the formation of electrodes 910, 920 comprising NiSi, $Ni_2Si$, $Ni_{31}Si_{12}$, $Ni_3Si$, or mixed phase crystals of Ni and Si, will cause an expansive stress on the gate's 205, 210 sidewalls 235, which could potentially delaminate the sidewalls 235 from the electrodes 910, 920.

In some embodiments, the anneal includes a first anneal having an uppermost temperature of about 400° C. and a second anneal having an uppermost temperature of about 500° C. E.g., is some cases the anneal includes a first anneal to a temperature of about 320 to 400° C. for about 30 to 60 seconds, followed by a second anneal to a temperature of about 400 to 500° C. for about 60 seconds. In some embodiments the first anneal is sufficient to fully diffuse the atoms of the first patterned silicon-containing electrode layers 225 and the metal layer 810 to form a homogenous fully silicided first gate electrodes 910. Consequently, the second anneal does not substantially change the distribution of atoms (e.g., Ni and Si atoms) in the fully silicided first gate electrodes 910. In such instances the second anneal serves to further diffuse the atoms of the second patterned silicon-containing electrode layers 230 and the metal layer 810.

In some cases, portions 930 of the metal layer 810 do not interdiffuse with the patterned first and second silicon-containing layers 225, 230 (FIG. 8). This unreacted metal layer portion 930 can be removed using conventional procedures before conducting additional device manufacturing steps. E.g., removing the unreacted metal layer portion 930 of nickel can include exposure to a solution of $H_2SO_4:H_2O_2$ in a 6:1 ratio. In some embodiments the unreacted metal portion 930 is removed between the first and second anneals.

An amount of the metal 305 (FIG. 8) at an interface 940 of the fully silicided gate electrode layer 910 and an underlying gate dielectric layer 215 is greater than an amount of the metal 805 an second interface 950 of the second fully silicided gate electrode layer 920 and an underlying second gate dielectric layer 220. In some instance, the amount of the metal 805 in the fully silicided first gate electrode 910 is greater than an amount of the metal 805 in the fully silicided second gate electrode 920. E.g., there can be a greater amount of nickel in the fully silicided first gate electrode layer 910 than in the fully silicided second gate electrode layer 920. In some cases, the fully silicided first gate electrode 910 comprises $Ni_2Si$ while the fully silicided second gate electrode layer 920 comprises NiSi. E.g., there can be $Ni_2Si$ and NiSi at the respective interfaces 940, 950 of the gates 205, 210. In other cases, the fully silicided first gate electrode 910 comprises $Ni_3Si$ or $Ni_{31}Si_{12}$, while the fully silicided second gate electrode layer 920 comprises NiSi (e.g., $Ni_3Si$ or $Ni_{31}Si_{12}$ at the interface 940 and NiSi at the second interface 950). A fully silicided first gate electrode 910 comprising $Ni_3Si$ or $Ni_{31}Si_{12}$ at the interface 940 has a higher work function than a fully silicided first gate electrode 910 comprising $Ni_2Si$ at the second interface 950 A fully silicided first gate electrode 910 comprising $Ni_2Si$, however, will impart less expansive stress on the first gate's 205 sidewalls 235 than $Ni_3Si$. In some cases, a fully silicided first gate electrode 910 comprising $Ni_{31}Si_{12}$ provide a suitable combination of high work function plus an acceptable level expansive stress.

Figure 10:
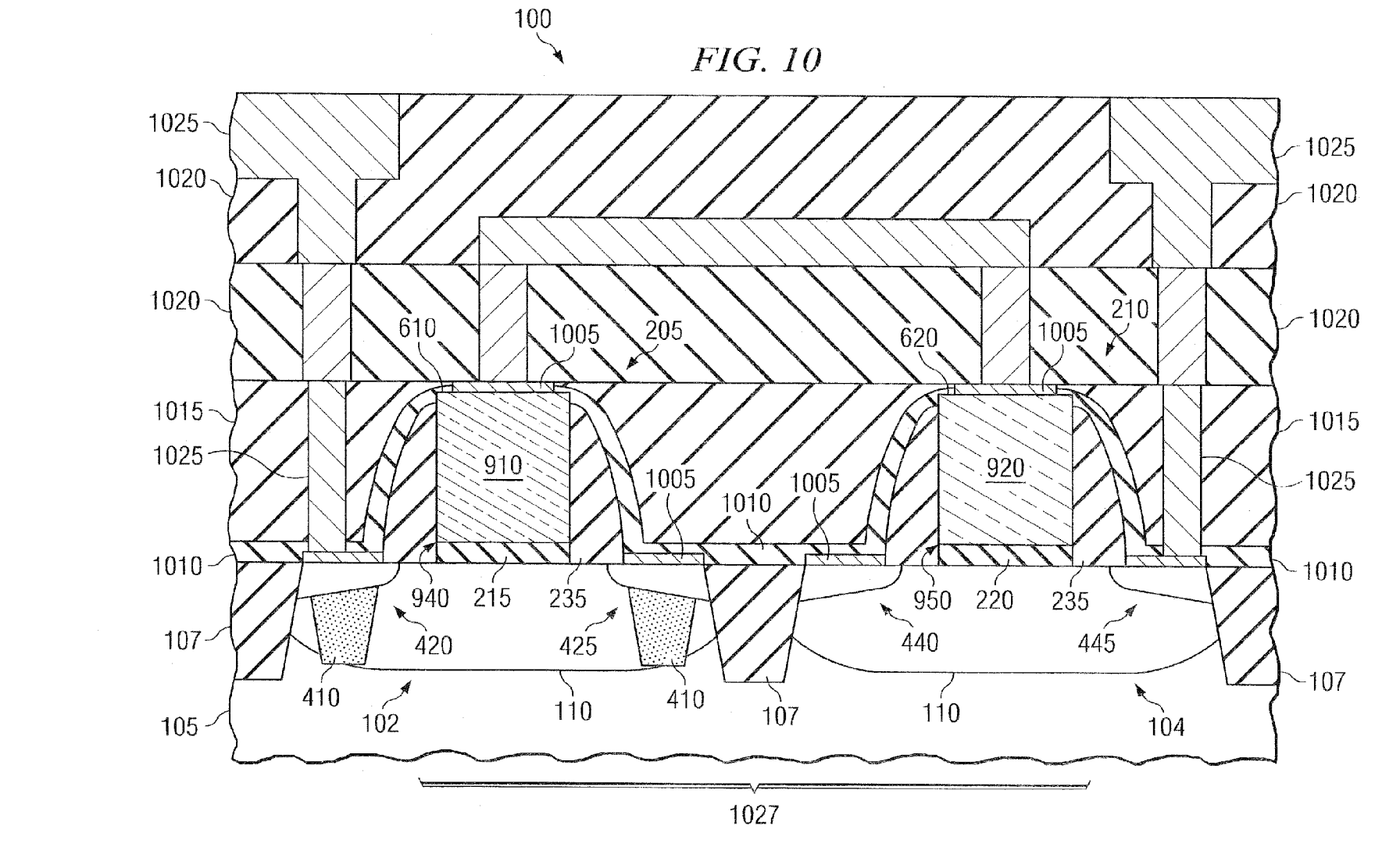

One skilled in the art would appreciate that there can be multiple additional manufacturing steps to complete the fabrication of the device 100. E.g., as illustrated in FIG. 10, for embodiments of the device 100 configured as an integrated circuit, the method can include conventional processes to remove the sacrificial layer 510 (FIG. 9), and form formed metal silicide electrodes 1005 on the source and drain structures 420, 425, 440, 445, and gate electrodes 910, 920. Thereafter a pre-metal nitride layer 1010 and pre-metal dielectric (PMD) layer 1015 can be deposited on the substrate 105. One or more inter-level dielectric layers (IDL) 1020 can then be deposited on the pre-metal dielectric layer 1015. As further illustrated, interconnects 1025 can be formed through the ILD layers 1010 and PMD layer 1005. The interconnects 1025 can include metal contacts, lines, single or dual damascene structures, comprising tungsten, copper, or other metals. Certain interconnects 1025 contact conventionally Formed metal silicide electrodes 1005 located on the source and drain structures 420, 425, 440, 445, and gate electrodes 910, 920, to thereby interconnect the transistors 102 to each other, or to other transistors 104 of the integrated circuit. E.g., the first and second transistors 102, 104, configured as PMOS and nMOS transistors, respectively, can be interconnected to form a complementary MOS (CMOS) device 1027.

FIG. 10 illustrates another embodiment, a semiconductor device 100. In this example, the device 100 is configured as an integrated circuit. The integrated circuit 100 can comprise one or more transistors 102, 104 on or in the semiconductor substrate 105. At least one of the transistors 102 includes a gate 205 having a fully silicided gate electrode layer 910 with a ratio of Ni:Si that ranges from about 2:1 to 3:1. The transistor 102 also includes source and drain structures 420, 425 located in openings 320, 322 of the substrate 105 and adjacent to the gate 205, wherein the source and drain structures 420, 425 are filled with SiGe.

As a consequence of performing the anneal as discussed in the context of FIG. 9, the gate 205 has an interface 940 that corresponds to that portion of the first fully silicided electrode layer 910 that directly contacts the first patterned gate dielectric layer 215. In some embodiments, the ratio of Ni to Si (Ni:Si) at the interface 940 equals about 2:1. In other embodiments, the Ni:Si ratio at the interface 940 equals about 3:1.

As further illustrated in FIG. 10 the device 100 configured as an integrated circuit can further include a second transistor 104. The second transistor 104 comprises a second gate 210 having a fully silicided second gate electrode layer 920. Similar to the first gate 205, the second gate 210 has a second interface 950. A ratio of Ni:Si at the second interface 950 ranges from about 0.9:1 to 1.1:1. The second transistor 104 also includes second source and drain structures 440, 445 located in the substrate 105 and adjacent to the second gate 210, wherein the second source and drain structures 440, 445 are free of SiGe.

The different NI:Si ratios at the interface 940 and second interface 950 facilitates the work function of the first transistor 102 and second transistor 104 to be different from each other. E.g., at least about 0.3 eV different in some cases, and about 0.8 eV in other cases. E.g., in some embodiments, the work function of the first transistor 102 configured as a pMOS transistor can range from about 4.8 to 5.0 eV. The work function of the second transistor 104 configured as an nMOS transistor can range from about 4.2 to 4.5 eV.

In some embodiments, the Ni:Si ratio in the second fully silicided gate electrode 920 increases from the second interface 950 to the upper surface 620 of the second gate 210. E.g., in some cases there is a continuously increasing gradient of Ni:Si from about 1:1 at the second interface 950 to about 2:1 or greater at the upper surface 620 of the fully silicided second gate electrode layer 920. This is in contrast to the first fully silicided gate electrode 910, which in the same embodiment, can have a uniform Ni to Si ratio from the interface 940 to the upper surface 610 of the first gate 210. E.g., the Ni:Si ratio changes by less than 10 percent from the interface 940 to the upper surface 610.

As discussed in the context of FIG. 4, in some embodiments, the second source and drain structures 440, 445 are not formed in openings of the substrate 105. Rather, the second source and drain structures 440, 445 can be formed by implanting dopants into the substrate 105 and annealing the substrates 105 to diffuse the dopants. In other cases, however, the second source and drain structures 440, 445 can be formed by forming openings in the substrate 105 and filing the openings with a strain producing material other than SiGe, e.g., SiC.

Those skilled in the art to which the invention relates will appreciate that other and further additions, deletions, substitutions and modifications may be made to the described example embodiments, without departing from the invention.

What is claimed is:

1. A method of manufacturing a semiconductor device, comprising:
   forming first and second gates including patterning a silicon-containing layer on a semiconductor substrate;
   etching simultaneously said patterned silicon-containing layer of said first gate and first substrate portions adjacent to said first gate, to form a first gate electrode opening and source and drain openings, respectively, wherein said second gate and second substrate portions adjacent to said second gate are masked;
   forming SiGe simultaneously in said first gate electrode openings and in said source and drain openings, wherein said second gate electrode and said second substrate portions are masked;
   removing said SiGe from an upper surface of said first gate to form a second opening therein;
   depositing a metal simultaneously on said first and second gates to form a metal layer thereon; and
   annealing said first and second gates to form fully silicided first and second gate electrodes, wherein an amount of said metal at an interface of said fully silicided gate electrode layer and an underlying gate dielectric layer is greater than an amount of said metal an second interface of said second fully silicided gate electrode layer and an underlying second gate dielectric layer.

2. The method of claim 1, wherein said simultaneous etch includes exposing said first gate and first substrate portions to an HBr-containing etchant gas.

3. The method of claim 1, wherein said simultaneous etch includes an isotropic etch and an anisotropic etch.

4. The method of claim 1, wherein forming said SiGe includes a chemical vapor deposition process using Si and Ge having about 0 to 50 percent atomic percent Ge.

5. The method of claim 1, wherein removing said SiGe from said upper surface of said first gate includes uncovering upper surfaces of said first and second gate electrodes.

6. The method of claim 5, wherein uncovering said upper surfaces includes a CMP process.

7. The method of claim 5, wherein uncovering said upper surfaces includes a nitride layer etch process.

8. The method of claim 1, wherein removing said SiGe layer includes subjecting said upper surfaces to an etchant having $NH_4OH$, $H_2O_2$ and $H_2O$.

9. The method of claim 1, wherein said metal layer includes a refractory metal.

10. The method of claim 1, wherein a ratio of a thickness of said metal layer to a thickness of said silicon-containing layer of said first gate ranges from about 2:1 to 3:1.

11. The method of claim 1, wherein a ratio of a thickness of said metal layer to a thickness of said silicon-containing layer for said second gate ranges from about 0.9:1 to 1.1:1.

12. The method of claim 1, wherein said annealing includes a first anneal having an uppermost temperature of about 400° C. and a second anneal having an uppermost temperature of about 500° C.

13. A method of manufacturing an integrated circuit, comprising:
    forming one or more transistors on a semiconductor substrate, wherein at least one of said transistors is manufactured by a process that includes:
        forming first and second gates, including patterning a silicon-containing layer on said semiconductor substrate;
        etching simultaneously said patterned sIlicon-containing layer of said first gate and first substrate portions adjacent to said first gate, to form a first gate electrode opening and source and drain openings, respectively, wherein said second gate and second substrate portions adjacent to said second gate are masked;
        forming SiGe simultaneously in said first gate electrode openings and on said source and drain openings, wherein said second gate and said second substrate portions are masked;
        depositing a sacrificial layer on said substrate, wherein said first and second gates are covered by said sacrificial layer;
        uncovering upper surfaces of said first and second gates, wherein said SiGe-filled source and drain openings remained covered;
        removing said SiGe from said upper surface of said first gate, wherein during said removal said upper surface of second gate is substantially unaltered;
        depositing a metal layer having nickel simultaneously on said first and second gates; and
        annealing said first and second gates to form fully silicided first and second gate electrodes wherein an amount of said nickel at an interface of said fully silicided gate electrode layer and an underlying gate dielectric layer is greater than an amount of said nickel at a second interface of said second fully silicided gate electrode layer and an underlying second gate dielectric layer;
    depositing a pre-metal dielectric layer on said substrate and inter-level dielectric layers on said pre-metal dielectric layer; and
    forming interconnects through one or more of said inter-level dielectric layers to interconnect said at least one transistors to each other, or to other transistors of said integrated circuit.

14. The method of claim 13, wherein removing said SiGe layer includes subjecting said upper surfaces to a wet etch using a mixture of about 1:1:5 $NH_4OH:H_2O_2:H_2O$.

15. The method of claim 13, wherein said annealing includes a first anneal of about 320 to 400° C. for about 30 to 50 seconds and a second anneal of about 400 to 500° C. for 60 seconds.

* * * * *